US009391260B2

(12) United States Patent
Ueda et al.

(10) Patent No.: US 9,391,260 B2
(45) Date of Patent: Jul. 12, 2016

(54) ACTUATOR AND METHOD FOR DRIVING THE SAME

(71) Applicant: PANASONIC CORPORATION, Osaka (JP)

(72) Inventors: Michihito Ueda, Kyoto (JP); Takakiyo Harigai, Osaka (JP); Yoshiaki Tanaka, Nara (JP); Hideaki Adachi, Osaka (JP); Eiji Fujii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 537 days.

(21) Appl. No.: 13/962,448

(22) Filed: Aug. 8, 2013

(65) Prior Publication Data

US 2013/0320806 A1 Dec. 5, 2013

Related U.S. Application Data

(63) Continuation of application No. PCT/JP2013/000075, filed on Jan. 11, 2013.

(30) Foreign Application Priority Data

Jan. 13, 2012 (JP) ................................ 2012-004997

(51) Int. Cl.
*H01L 41/09* (2006.01)
*H01L 41/187* (2006.01)
(Continued)

(52) U.S. Cl.
CPC ........ *H01L 41/0933* (2013.01); *H01L 41/0993* (2013.01); *H01L 41/1873* (2013.01); *H01L 41/1878* (2013.01); *H01L 41/316* (2013.01); *G02B 26/0858* (2013.01)

(58) Field of Classification Search
CPC ..................................................... H01L 41/0933
USPC .................................................. 310/330–332
See application file for complete search history.

(56) References Cited

U.S. PATENT DOCUMENTS

| 2,842,685 | A | * | 7/1958 | Petermann | ............ | B06B 1/0603 |
| | | | | | | 310/322 |
| 2004/0140535 | A1 | * | 7/2004 | Kondo | .................... | C23C 14/28 |
| | | | | | | 257/646 |

(Continued)

FOREIGN PATENT DOCUMENTS

| JP | 04-058769 A | 2/1992 |
| JP | 06-097527 A | 4/1994 |

(Continued)

OTHER PUBLICATIONS

International Search Report issued in International Patent Application No. PCT/JP2013/000075 mailed on Apr. 16, 2013.

*Primary Examiner* — J. San Martin
(74) *Attorney, Agent, or Firm* — McDermott Will & Emery LLP

(57) ABSTRACT

Provided is a novel actuator and a method for driving the same. The present invention is an actuator comprising a first laminate comprising a first (Bi, Na, Ba) $TiO_3$ layer between first and second electrode layers, a second laminate comprising a second (Bi, Na, Ba) $TiO_3$ layer between third and fourth electrode layers, and a tilt part provided between the first and second laminates. Both of the first and second (Bi, Na, Ba) $TiO_3$ layers are preferentially oriented in a [011] crystalline axis direction. Voltages V5$a$, V9$a$, V5$b$, and V9$b$ which satisfy Requirement A: V5$a$>V9$a$ and V5$b$<V9$b$ or Requirement B: V5$a$<V9$a$ and V5$b$>V9$b$ are applied to the first-fourth electrode layers so as to tilt the tilt part. One of the first edge and the second edge is moved in the [011] crystalline axis direction and the other is moved in the reverse direction thereof.

16 Claims, 14 Drawing Sheets

(51) Int. Cl.
*H01L 41/316* (2013.01)
*G02B 26/08* (2006.01)

(56) References Cited

U.S. PATENT DOCUMENTS

| | | | |
|---|---|---|---|
| 2005/0006983 A1 | 1/2005 | Witteveen | |
| 2007/0267947 A1 | 11/2007 | Matsushita et al. | |
| 2011/0278991 A1* | 11/2011 | Harigai | H02N 2/186 310/339 |
| 2012/0043857 A1* | 2/2012 | Ueda | H01L 41/042 310/330 |

FOREIGN PATENT DOCUMENTS

| | | |
|---|---|---|
| JP | 11-261127 A | 9/1999 |
| JP | 2000-232331 A | 8/2000 |
| JP | 2004-253762 A | 9/2004 |
| JP | 2005-506829 A | 3/2005 |
| JP | 2005-139064 A | 6/2005 |
| JP | 2008-004781 A | 1/2008 |
| JP | 2008-187881 A | 8/2008 |
| JP | 2009-142046 A | 6/2009 |
| JP | 2009-169290 A | 7/2009 |

* cited by examiner

ACTUATOR AND METHOD FOR DRIVING THE SAME

This is a continuation of International Application No. PCT/JP2013/000075, with an international filing date of Jan. 11, 2013, which claims priority of Japanese Patent Application No. 2012-004997, filed on Jan. 13, 2012, the contents of which are hereby incorporated by reference.

BACKGROUND OF THE INVENTION

1. Field of the Invention

The present invention relates to an actuator and a method for driving the same.

2. Description of the Related Art

FIG. 13 shows an actuator disclosed in Japanese Patent Laid-Open Publication No. 2009-169290.

This actuator 100 comprises a support layer 104, a first electrode layer 105, a first piezoelectric layer 106R, a second piezoelectric layer 106L, a second electrode layer 107R, and a third electrode layer 107L.

Two piezoelectric actuators 108R and 108L are formed in this actuator 100. The first piezoelectric actuator 108R is constituted with the right half 104R of the support layer 104, the right half 105R of the first electrode layer 105, the first piezoelectric layer 106R, and the second electrode layer 107R. The second piezoelectric actuator 108L is constituted with the left half 104L of the support layer 104, the left half 105L of the first electrode layer 105, the second piezoelectric layer 106L, and the third electrode layer 107L.

A torsion bar 102 is fixed to the bottom face of the support layer 104. The torsion bar 102 is interposed between the first piezoelectric actuator 108R and the second piezoelectric actuator 108L when viewed in the cross-sectional view of FIG. 13. The torsion bar 102 has a longitudinal direction perpendicular to both the lamination direction of these layers 104-107 (namely, the vertical direction in FIG. 13) and the longitudinal direction of the support layer 104 (namely, the horizontal direction in FIG. 13). A mirror 101 is provided at one end of the torsion bar 102.

A voltage of 0 volts, a negative voltage, and a positive voltage are applied to the first electrode layer 105, the second electrode layer 107R, and the third electrode layer 107L, respectively. As shown in FIG. 13, this voltage application allows the actuator 100 to be twisted so as to tilt the mirror 101.

SUMMARY OF THE INVENTION

A purpose of the present invention is to provide a novel actuator and a method for driving the same.

The present invention is a method for driving an actuator 1, the method comprising steps of:

a step (a) of preparing the actuator 1 comprising:
a first laminate 11a;
a second laminate 11b;
a first support 13a;
a second support 13b; and
a tilt part 25, wherein
the first laminate 11a comprises a first electrode layer 5a, a first (Bi, Na, Ba) $TiO_3$ layer 7a, and a second electrode layer 9a;
the first electrode layer 5a, the first (Bi, Na, Ba) $TiO_3$ layer 7a, and the second electrode layer 9a are laminated in such a manner that the first (Bi, Na, Ba) $TiO_3$ layer 7a is interposed between the first electrode layer 5a and the second electrode layer 9a;

the first (Bi, Na, Ba) $TiO_3$ layer 7a is preferentially oriented in a [011] crystalline axis direction;
+Z direction is parallel to the [011] crystalline axis direction;
−Z direction is the reverse direction of the +Z direction;
+X direction is parallel to the longitudinal direction of the first laminate 11a;
−X direction is the reverse direction of the +X direction;
+Y direction is perpendicular to both of the +X direction and the +Z direction in a right-handed coordinate system;
−Y direction is the reverse direction of the +Y direction;
the laminate direction of the first laminate 11a is parallel to the +Z direction;
the second laminate 11b comprises a third electrode layer 5b, a second (Bi, Na, Ba) $TiO_3$ layer 7b, and a fourth electrode layer 9b;
the second (Bi, Na, Ba) $TiO_3$ layer 7b is preferentially oriented in the [011] crystalline axis direction;
the second (Bi, Na, Ba) $TiO_3$ layer 7b is interposed between the third electrode layer 5b and the fourth electrode layer 9b along the +Z direction;
the tilt part 25 is interposed between the first laminate 11a and the second laminate 11b along the +X direction;
the tilt part 25 comprises a first edge 25a and a second edge 25b; the first edge 25a and the second edge 25b are located in the +Y side and the −Y side, respectively, in the XY plane;
one end of the first laminate 11a is fixed to the first support 13a;
one end of the second laminate 11b is fixed to the second support 13b; and
in the XY plane, an angular degree Q formed between the +X direction and a [100] direction is more than 0 degrees and less than 90 degrees; and
a step (b) of applying the voltages V5a, V9a, V5b, and V9b which satisfy the following requirement A or B to the first electrode layer 5a, the second electrode layer 9a, the third electrode layer 5b, and the fourth electrode layer 9b, respectively, so as to tilt the tilt part 25 in such a manner that one of the first edge 25a and the second edge 25b is moved in the +Z direction and the other is moved in the −Z direction;
Requirement A: V5a>V9a and V5b<V9b
Requirement B: V5a<V9a and V5b>V9b.

In one embodiment, in the step (b), the requirement A is satisfied; and
the first edge 25a is moved in the −Z direction and the second edge 25b is moved in the +Z direction.

In one embodiment, in the step (b), the requirement B is satisfied; and
the first edge 25a is moved in the +Z direction and the second edge 25b is moved in the −Z direction.

In one embodiment, the angular degree Q is not less than 15 degrees and not more than 75 degrees.

In one embodiment, the angular degree Q is not less than 30 degrees and not more than 60 degrees.

In one embodiment, the first electrode 5a is formed integrally with the third electrode layer 5b.

In one embodiment, the first (Bi, Na, Ba) $TiO_3$ layer 7a is formed integrally with the second (Bi, Na, Ba) $TiO_3$ layer 7b.

In one embodiment, the first (Bi, Na, Ba) $TiO_3$ layer 7a is formed of $(Bi_{0.5}Na)_{0.5}TiO_3$—$BaTiO_3$; and
the second (Bi, Na, Ba) $TiO_3$ layer 7b is formed of $(Bi_{0.5}Na)_{0.5}TiO_3$—$BaTiO_3$.

In one embodiment, the first (Bi, Na, Ba) $TiO_3$ layer 7a is formed of a laminate of a $(1-x)(Bi_{0.5},Na_{0.5})TiO_3)-x(BaTiO_3)$ layer ($0.01 \leq x \leq 0.15$) and a $(1-y)[(Bi,Na,Ba)TiO_3]-yBiFeO_3$ layer ($0.20 \leq y \leq 0.50$); and the second (Bi, Na, Ba) TiO$_3$ layer 7b is formed of a laminate of a (1−x)(Bi$_{0.5}$,Na$_{0.5}$)TiO$_3$)−x(BaTiO$_3$) layer (0.01≤x≤0.15) and a (1−y)[(Bi,Na,Ba)TiO$_3$]−yBiFeO$_3$ layer (0.20≤y≤0.50)

The present invention includes the above-mentioned actuator.

The present invention provides a novel actuator and a method for driving the same.

DETAILED DESCRIPTION OF THE PREFERRED EMBODIMENTS

An embodiment of the present invention is described below with reference to the drawings.

Embodiment 1

Step (a)

Figure 1A:
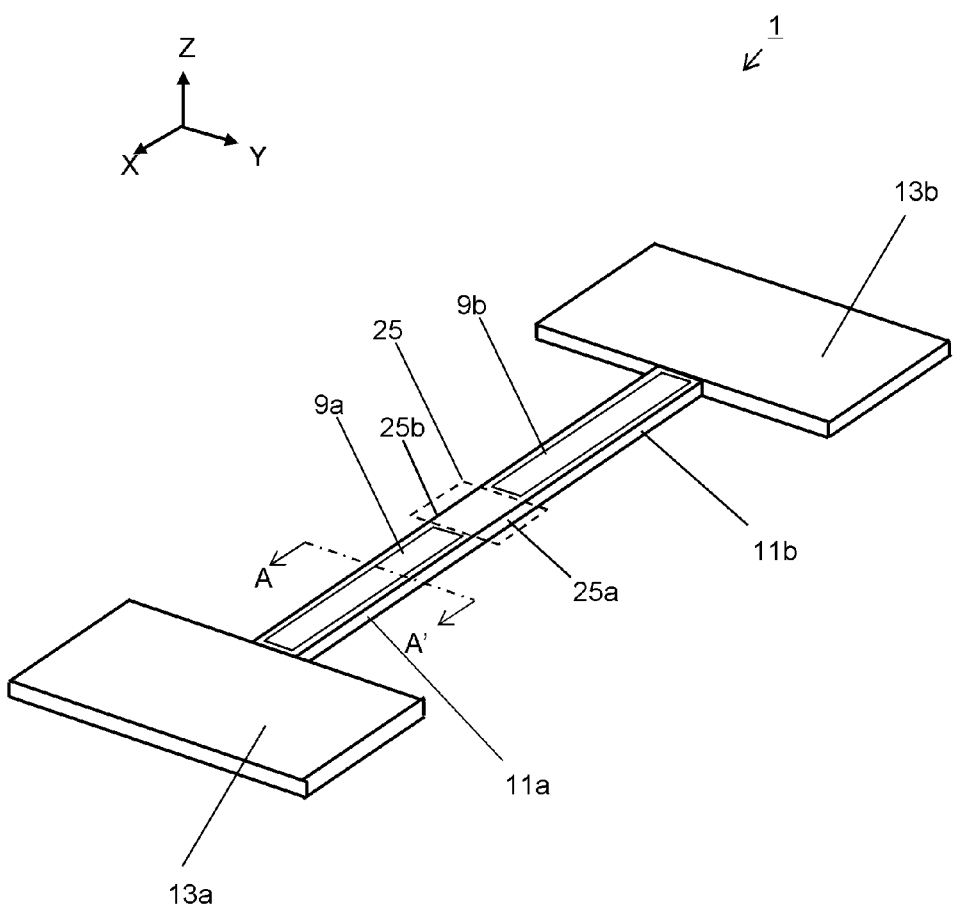
FIG. 1A shows a perspective view of an actuator 1 according to an embodiment.

FIG. 1A shows an actuator 1 according to the embodiment. This actuator 1 comprises a first laminate 11a, a second laminate 11b, a first support 13a, a second support 13b and a tilt part 25.

Figure 2:
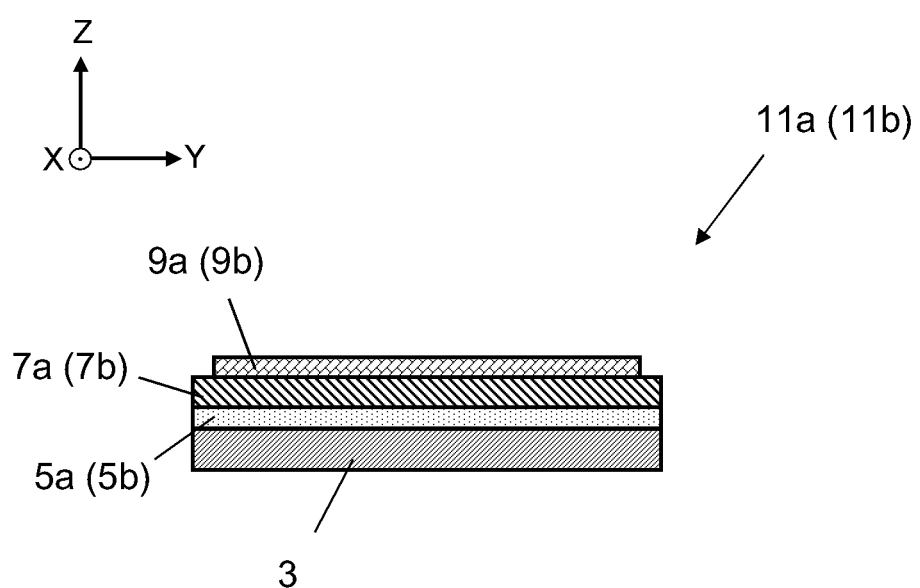
FIG. 2 shows a cross-sectional view taken along A-A' line included in FIG. 1.

FIG. 2 shows a cross-sectional view taken along A-A' line included in FIG. 1A. The first laminate 11a comprises a first electrode layer 5a, a first (Bi, Na, Ba) TiO$_3$ layer 7a, and a second electrode layer 9a in this order. The first electrode layer 5a is formed on a substrate 3. The first (Bi, Na, Ba) TiO$_3$ layer 7a and the second electrode layer 9a are stacked in this order on the first electrode layer 5a.

Similarly to this first laminate 11a, the second laminate 11b comprises a third electrode layer 5b, a second (Bi, Na, Ba) TiO$_3$ layer 7b, and a fourth electrode layer 9b in this order.

It is desirable that the first laminate 11a and the second laminate 11b are rectangular. As shown in FIG. 1A, the longitudinal direction of the first laminate 11a is parallel to the +X direction, as described later.

The first (Bi, Na, Ba) TiO$_3$ layer 7a and the second (Bi, Na, Ba) TiO$_3$ layer 7b are preferentially oriented in the [011] crystalline axis direction. Desirably, the first (Bi, Na, Ba) TiO$_3$ layer 7a and the second (Bi, Na, Ba) TiO$_3$ layer 7b are oriented only in the [011] crystalline axis direction. Hereinafter, "the [011] crystalline axis direction" is referred to as "the [011] direction". When the first (Bi, Na, Ba) TiO$_3$ layer 7a and the second (Bi, Na, Ba) TiO$_3$ layer 7b are oriented in a direction other than the [011] direction, the actuator 1 fails to work. See the comparative example 3, which is described later.

(Bi, Na, Ba) TiO$_3$ is a material known as a piezoelectric material. The (Bi, Na, Ba) TiO$_3$ is referred to as "NBT-BT" or "BNT-BT". A typical example of the (Bi, Na, Ba) TiO$_3$ is (Bi$_{0.5}$, Na$_{0.5}$)TiO$_3$—BaTiO$_3$. In more detail, this is (1−x)(Bi$_{0.5}$, Na$_{0.5}$) TiO$_3$−x(BaTiO$_3$). x represents a value of not less than 0.01 and not more than 0.15.

The (Bi, Na, Ba) TiO$_3$ may contain other metallic oxide. An example of other metallic oxide is BiFeO$_3$. The (Bi, Na, Ba) TiO$_3$ may contain impurities to improve the piezoelectric property. An example of the impurity is silver, niobium, tantalum or manganese.

The first (Bi, Na, Ba) TiO$_3$ layer 7a may be formed of two or more (Bi, Na, Ba) TiO$_3$ layers. These two or more (Bi, Na, Ba) TiO$_3$ layers may have a different compositions. For example, the first (Bi, Na, Ba) TiO$_3$ layer 7a may be formed of a laminate of a (1−x)(Bi$_{0.5}$,Na$_{0.5}$)TiO$_3$)−x(BaTiO$_3$) layer (0.01≤x≤0.1) and a (1−y)[(Bi,Na,Ba)TiO$_3$]−yBiFeO$_3$ layer (0.20≤y≤0.50). See the examples 6-8, which are described later. Similarly to the first (Bi, Na, Ba) TiO$_3$ layer 7a, the second (Bi, Na, Ba) TiO$_3$ layer 7b may be formed of two or more (Bi, Na, Ba) TiO$_3$ layers.

It is desirable that the first electrode layer 5a and the second electrode layer 5b are preferentially oriented in the [011] direction. The first electrode layer 5a and the second electrode layer 5b may be formed of a metallic film or an oxide conductor film. Two or more films may be used. An example of the material of the metallic film is platinum, palladium, or gold. An example of the material of the oxide conductor film is nickel oxide, ruthenium oxide, iridium oxide, strontium ruthenate, or lanthanum nickelate.

The first (Bi, Na, Ba) TiO$_3$ layer 7a and the second (Bi, Na, Ba) TiO$_3$ layer 7b may contain a small amount of impurities such as manganese or iron to improve the piezoelectric property. The first (Bi, Na, Ba) TiO$_3$ layer 7a and the second (Bi, Na, Ba) TiO$_3$ layer 7b can be formed by sputtering.

As shown in FIG. 1A, it is desirable that the first electrode layer 5a is formed on the substrate 3 integrally with the third electrode layer 5b. Similarly, it is desirable that the first (Bi, Na, Ba) TiO$_3$ layer 7a is formed integrally with the second (Bi, Na, Ba) TiO$_3$ layer 7b. An example of the material of the substrate 3 may be magnesium oxide or strontium titanate. A magnesium oxide substrate is preferable, since it is easy for the first (Bi, Na, Ba) TiO$_3$ layer 7a to be preferentially oriented in the +Z direction.

It is necessary that the second electrode layer 9a and the fourth electrode layer 9b are insulated electrically. This is because the voltage applied to the second electrode layer 9a is different from the voltage applied to the fourth electrode layer 9b, as described later. An example of the material of the second insulating layer 9a and the fourth electrode layer 9b is gold.

It is desirable that the length along the +X direction of the second electrode layer 9a is equal to the length along the +X direction of the fourth electrode layer 9b. In other words, it is desirable that the tilt part 25 is provided at the center of the actuator 1.

Figure 1B:
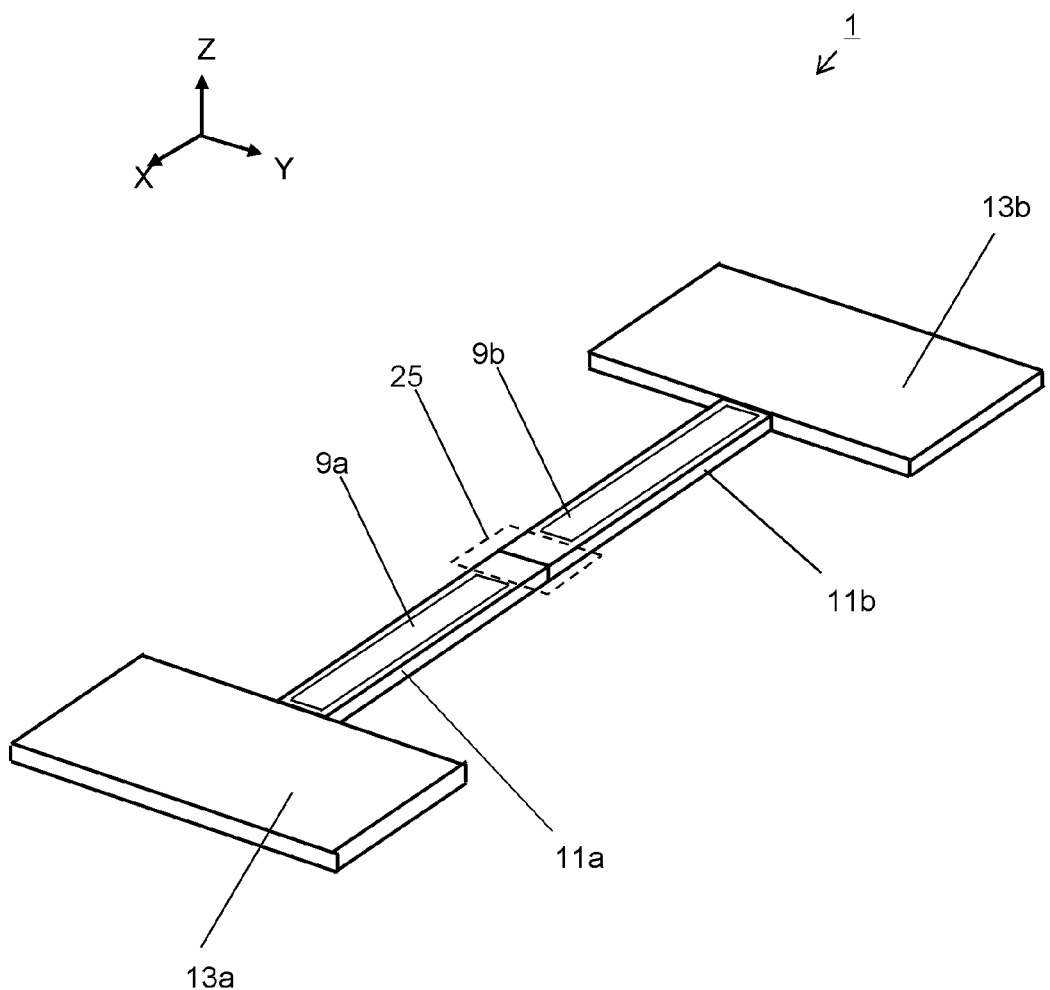
FIG. 1B shows a variation of FIG. 1A.

Unlike in FIG. 1A, the first laminate 11a and the second laminate 11b may be formed separately. Subsequently, as shown in FIG. 1B, one end of the first laminate 11a may be joined to the one end of the second laminate 11b with epoxy resin or solder.

Here, three directions used in the present specification are defined as below.

+X direction is the direction parallel to the longitudinal direction of the first laminate 11a.

−X direction is the reverse direction of the +X direction.

+Z direction is the direction parallel to the laminate direction of the first laminate 11a and parallel to the [011] direction. In other words, the laminate direction of the first laminate 11a is the [011] direction.

−Z direction is the reverse direction of the +Z direction.

+Y direction is the direction perpendicular to both the +X direction and the +Z direction.

−Y direction is the reverse direction of the +Y direction.

As shown in FIG. 1A, the tilt part 25 is interposed between the first laminate 11a and the second laminate 11b along the +X direction. In other words, the first laminate 11a and the second laminate 11b are adjacent to each other along the +X direction in such a manner that the tilt part 25 is interposed therebetween.

Figure 7:
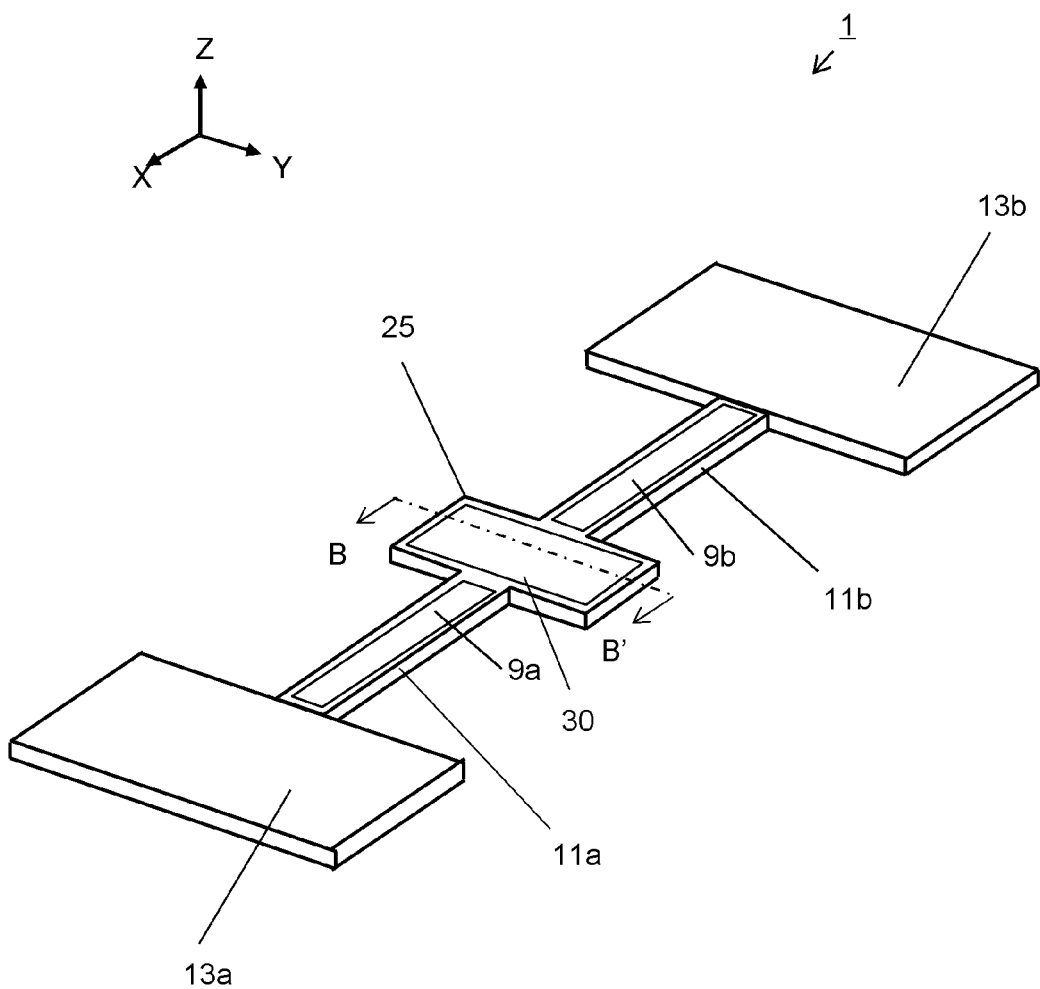
FIG. 7 shows a perspective view of another actuator 1 according to the embodiment.

The shape of the tilt part 25 is not limited. It is desirable that the tilt part 25 is plate-like. In FIG. 1A, the tilt part 25 has the same width as the first laminate 11a and the second laminate 11b. Here, the "width" means the length along the +Y direction. However, as shown in FIG. 7, it is desirable that the tilt part 25 is wider than the first laminate 11a. It is desirable that the tilt part 25 has a mirror 30 on the surface thereof. The mirror 30 reflects light.

The tilt part 25 comprises a first edge 25a and a second edge 25b. In the XY plane, the first edge 25a is located in the +Y side. In the XY plane, the second edge 25b is located in the −Y side.

One end of the first laminate 11a is fixed to the first support 13a. It is desirable that the first support 13a is plate-like. In more detail, one end at the +X side of the first laminate 11a is fixed to the side of the plate-like first support 13a with epoxy resin or solder. Similarly, one end of the second laminate 11b is fixed to the second support 13b. In more detail, one end at the −X side of the second laminate 11b is fixed to the side of the second support 13b.

Figure 3:
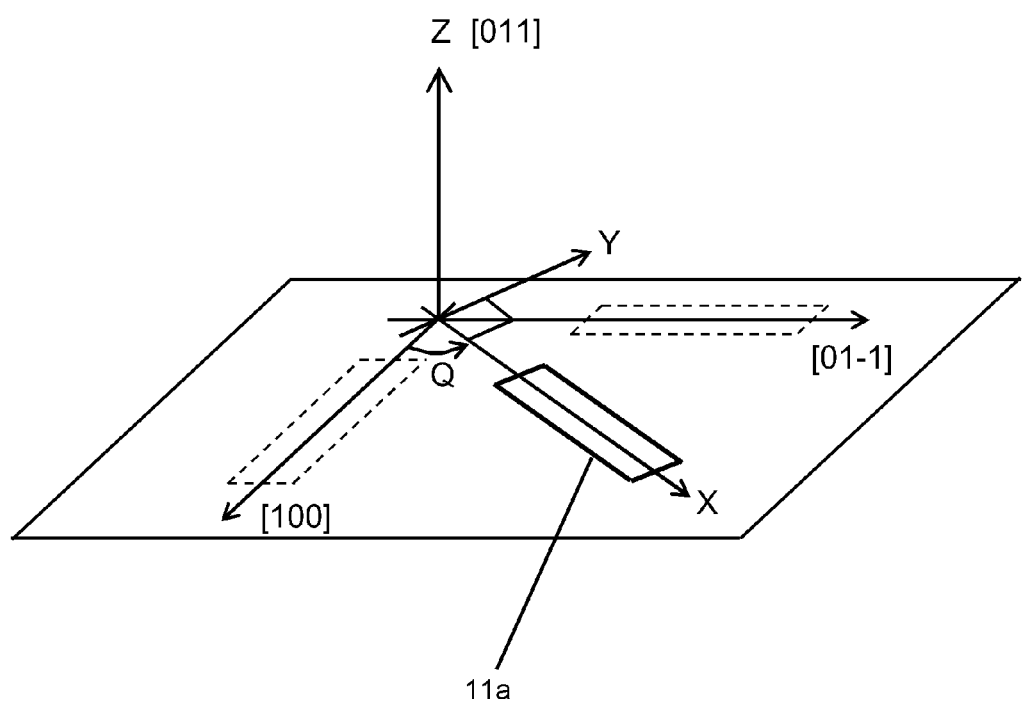
FIG. 3 shows axes of coordinates in the embodiment.

As shown in FIG. 3, an angular degree Q formed between the +X direction and the [100] direction is more than zero degrees and less than 90 degrees. It is preferable that the angular degree Q is not less than 15 degrees and not more than 75 degrees, as is clear from the examples 1-5, which are described later. It is more preferable that the angular degree Q is not less than 30 degrees and not more than 60 degrees, as is clear from the examples 1-3, which are described later.

When the angular degree Q is equal to zero degrees, that is, when the +X direction is parallel to the [100] direction, the actuator fails to drive. See the comparative example 1, which is described later. Similarly, when the angular degree Q is equal to 90 degrees, that is, when the +X direction is parallel to the [01-1] direction, the actuator fails to drive. See the comparative example 2, which is described later.

Step (b)

Then, a method for driving such an actuator 1 is described below.

Figure 4:
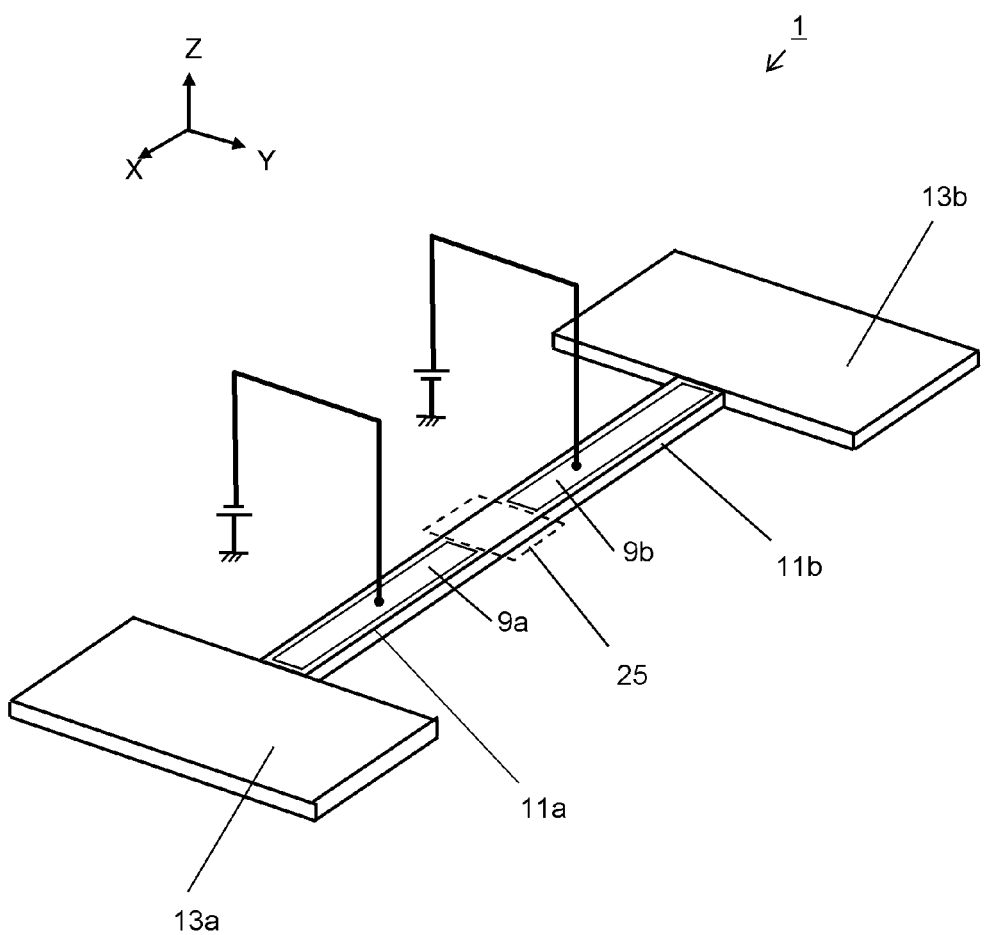
FIG. 4 shows a method for driving the actuator 1 according to the embodiment.
Figure 5:
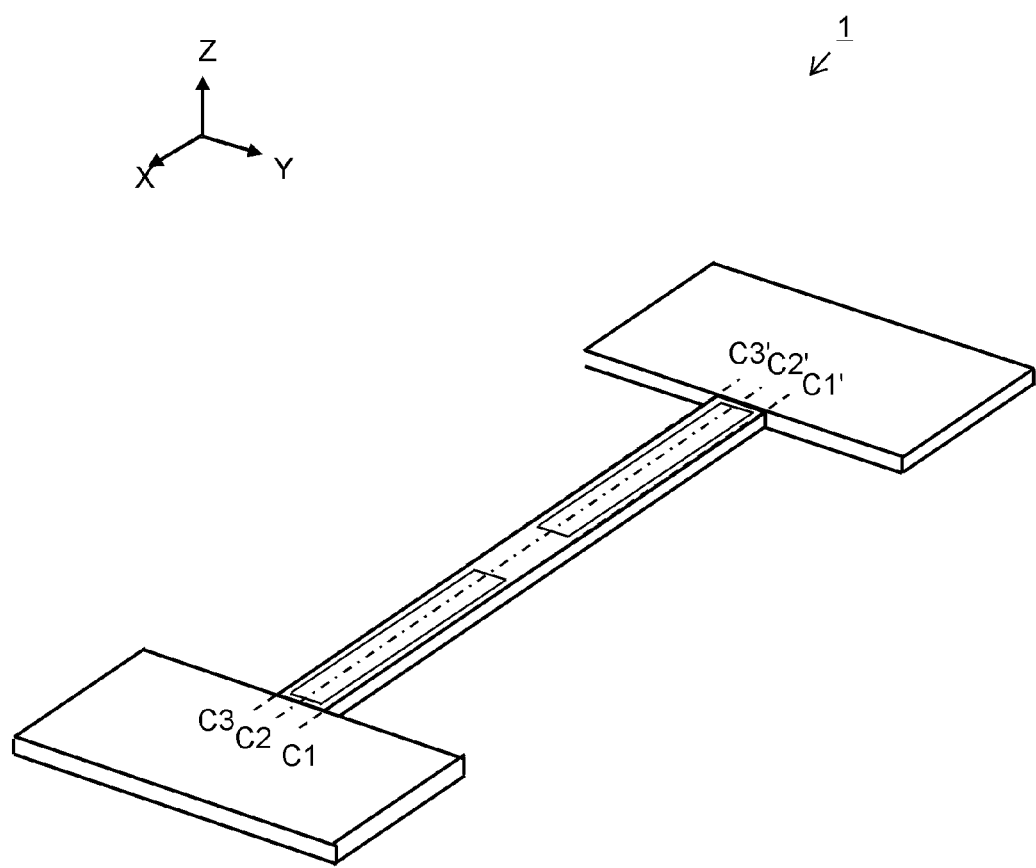
FIG. 5 shows a perspective view of the actuator 1 according to the embodiment.

As shown in FIG. 4, voltages V5a, V9a, V5b, and V9b which satisfy the following requirement A are applied to the first electrode layer 5a, the second electrode layer 9a, the third electrode layer 5b, and the fourth electrode layer 9b, respectively.

Requirement A: V5a>V9a and V5b<V9b

As shown in FIG. 5, FIG. 6A, FIG. 6B, FIG. 6C, and FIG. 11, this voltage application allows the first edge 25a to be moved in the −Z direction and allows the second edge 25b to be moved in the +Z direction. In this way, the actuator 1 is twisted. In other words, the tilt part 25 is tilted. The tilt angle is defined as an angular degree P. See FIG. 11. A power supply (not shown) may be used for this voltage application.

Figure 6A:
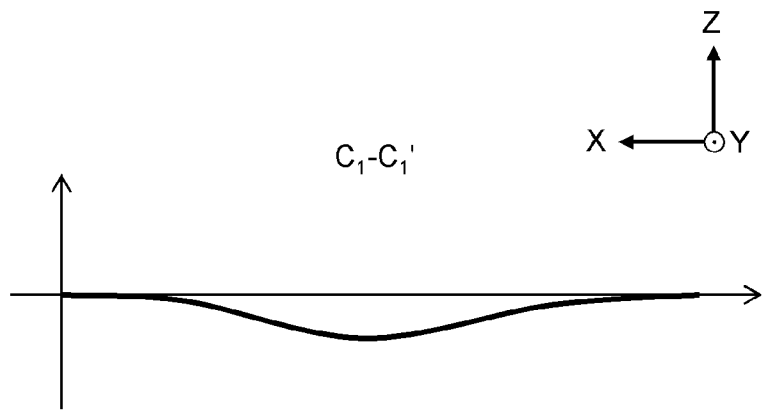
FIG. 6A shows a cross-sectional view taken along C1-C1' line included in FIG. 5 while the actuator 1 is driven.
Figure 6B:
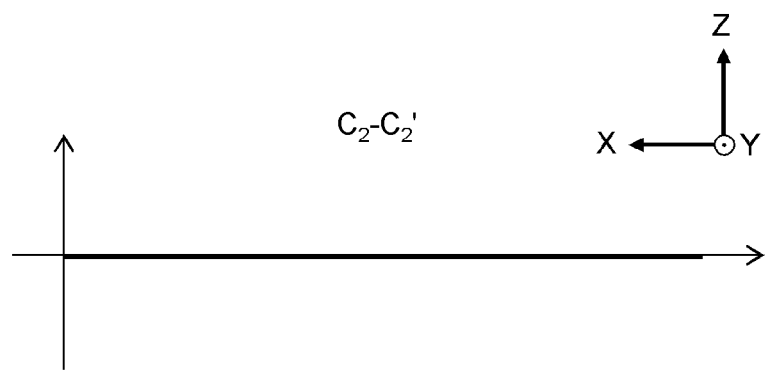
FIG. 6B shows a cross-sectional view taken along C2-C2' line included in FIG. 5 while the actuator 1 is driven.
Figure 6C:
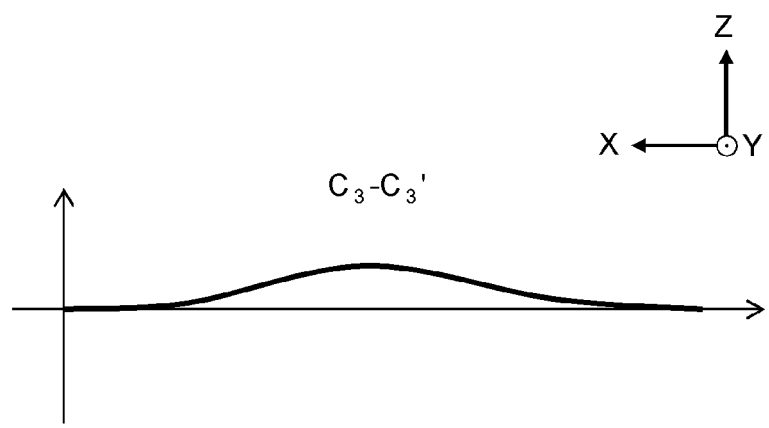
FIG. 6C shows a cross-sectional view taken along C3-C3' line included in FIG. 5 while the actuator 1 is driven.
Figure 11:
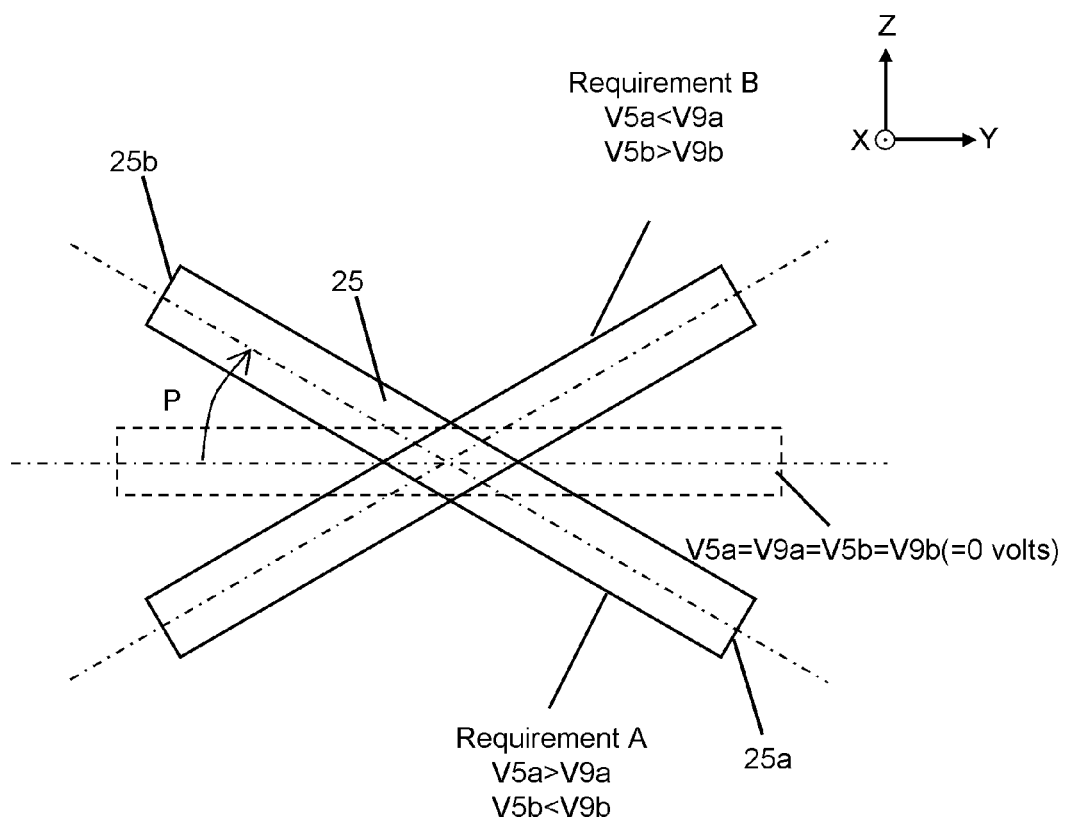
FIG. 11 shows a cross-sectional view taken along B-B' line included in FIG. 7.

FIG. 5, FIG. 6A, FIG. 6B, and FIG. 6C are described below in more detail. FIG. 6A, FIG. 6B, and FIG. 6C show the cross-sectional views taken along C1-C1', C2-C2', and C3-C3' lines included in FIG. 5, respectively. FIG. 11 shows a cross-sectional view taken along B-B' line included in FIG. 7.

As shown in FIG. 6A, when the voltages are applied, the ends at the +Y side of the first laminate 11a and the second laminate 11b move to the −Z direction. In this way, the first edge 25a moves to the −Z direction. On the other hand, as shown in FIG. 6C, when the voltages are applied, the ends at the −Y side of the first laminate 11a and the second laminate 11b move to the +Z direction. In this way, the second edge 25b moves to the +Z direction. See also FIG. 11.

Since it is desirable that the first electrode layer 5a and the third electrode layer 5b are formed integrally, it is desirable that the value of the voltage V5a is equal to the value of the voltage V5b. More desirably, both of the values of voltages V5a and V5b are 0 volts.

It is desirable that the value of (V5a-V9a) is not more than 30 volts. In other words, the value of the voltage V9a is less than 0 volts and not less than −30 volts. Similarly, it is desirable that the value of (V9b-V5b) is not more than 30 volts. In other words, it is desirable that the value of the voltage V9b is more than 0 volts and not more than 30 volts. Desirably, the value of the voltage V9a is equal to the value of the voltage V9b. Therefore, a desirable requirement A is V9b>V5a=V5b=0 volts>V9a.

Instead of the requirement A, the voltages V5a, V9a, V5b, and V9b which satisfy the following requirement B are applied to the first electrode layer 5a, the second electrode layer 9a, the third electrode layer 5b, and the fourth electrode layer 9b, respectively.

Requirement B: V5a<V9a and V5b>V9b

This voltage application allows the first edge 25a to be moved in the +Z direction and allows the second edge 25b to be moved in the −Z direction. In this way, the actuator 1 is twisted. In other words, the tilt part 25 is tilted. See also FIG. 11.

When the voltages application is stopped, the actuator 1 restores it original shape. In other words, the tilt angle P returns to zero degrees.

EXAMPLE

The following examples describe the present invention in more detail.

Example 1

In the example 1, the actuator 1 shown in FIG. 7 was fabricated. In the example 1, the angular degree Q was set at 45 degrees.

The first laminate 11*a* had an X-direction length of 8 millimeters and a Y-direction length of 2 millimeters. The substrate 3 was an MgO single crystalline substrate having a thickness of 50 micrometers. The tilt part 25 had an X-direction length of 2 millimeters and a Y-direction length of 4 millimeters.

The actuator 1 was fabricated in accordance with the procedure shown in FIGS. 9A-9E.

An MgO single crystalline substrate 3 was prepared. This MgO single crystalline substrate 3 had a normal direction of only a [001] direction, and had no other axis direction. The MgO single crystalline substrate 3 had a thickness of 0.5 millimeters.

The first electrode layer 5*a* and the third electrode layer 5*b* both of which are formed of platinum were formed integrally on the surface of this MgO single crystalline substrate 3 by an RF magnetron sputtering method. The first electrode layer 5*a* and the third electrode layer 5*b* had the [011] axial direction. In other words, the normal directions of the first electrode layer 5*a* and the third electrode layer 5*b* were the [011] direction. Each of the first electrode layer 5*a* and the third electrode layer 5*b* had a thickness of 250 nanometers.

The condition of the RF magnetron sputtering method is described below.

Target: Metal platinum
Atmosphere: Argon gas
RF power: 15 W
Substrate temperature: 300 Celsius degrees Then, a (Bi, Na, Ba) $TiO_3$ layer having a thickness of 2.7 micrometers was deposited on the surfaces of the first electrode layer 5*a* and the third electrode layer 5*b* by an RF magnetron sputtering method so as to form the first (Bi, Na, Ba) $TiO_3$ layer 7*a* and the second (Bi, Na, Ba) $TiO_3$ layer 7*b* integrally.

The condition of the RF magnetron sputtering method is described below.

Figure 10:
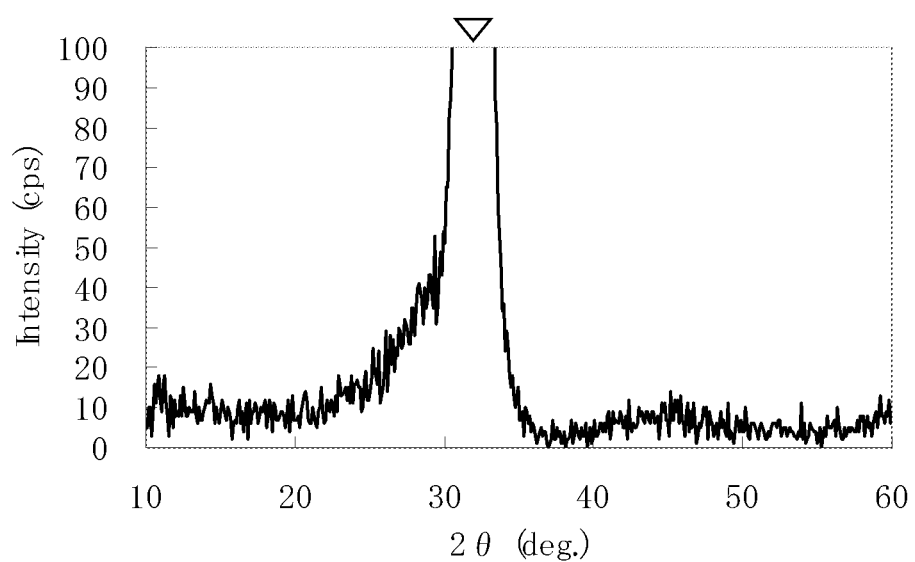
FIG. 10 shows an X-ray diffraction profile of the piezoelectric film according to the example 1.

Target: Above-mentioned composition
Atmosphere: Gaseous mixture of argon and oxygen ($Ar/O_2$ flow ratio: 50/50)
RF power: 170 W
Substrate temperature: 650 Celsius degrees The crystalline structures of the first (Bi, Na, Ba) $TiO_3$ layer 7*a* and the second (Bi, Na, Ba) $TiO_3$ layer 7*b* were analyzed by an X-ray diffraction method. FIG. 10 shows the result of the X-ray diffraction profile.

The intensity of the reflection peak was a very high value of 255,956 cps. The profile shown in FIG. 10 means that the first (Bi, Na, Ba) $TiO_3$ layer 7*a* and the second (Bi, Na, Ba) $TiO_3$ layer 7*b* according to the example 1 were oriented strongly in the crystalline axis direction, namely, in the +Z direction.

Then, a mask layer 71 was formed on the surfaces of the first (Bi, Na, Ba) $TiO_3$ layer 7*a* and the second (Bi, Na, Ba) $TiO_3$ layer 7*b*. The mask layer 71 was formed by an RF magnetron sputtering method. The mask layer 71 was formed of a chrome layer having a thickness of 0.3 micrometers.

The condition of the RF magnetron sputtering method is described below.

Target: Metal chrome
Atmosphere: Argon gas
RF power: 150 W
Substrate temperature: Room temperature A resist was applied on the mask layer 71 to form a resist pattern 73 through exposure and development. See FIG. 9A.

The mask layer 71 was dry-etched using the resist pattern 73 as a mask.

The condition of the dry etching is described below.

Figure 8:
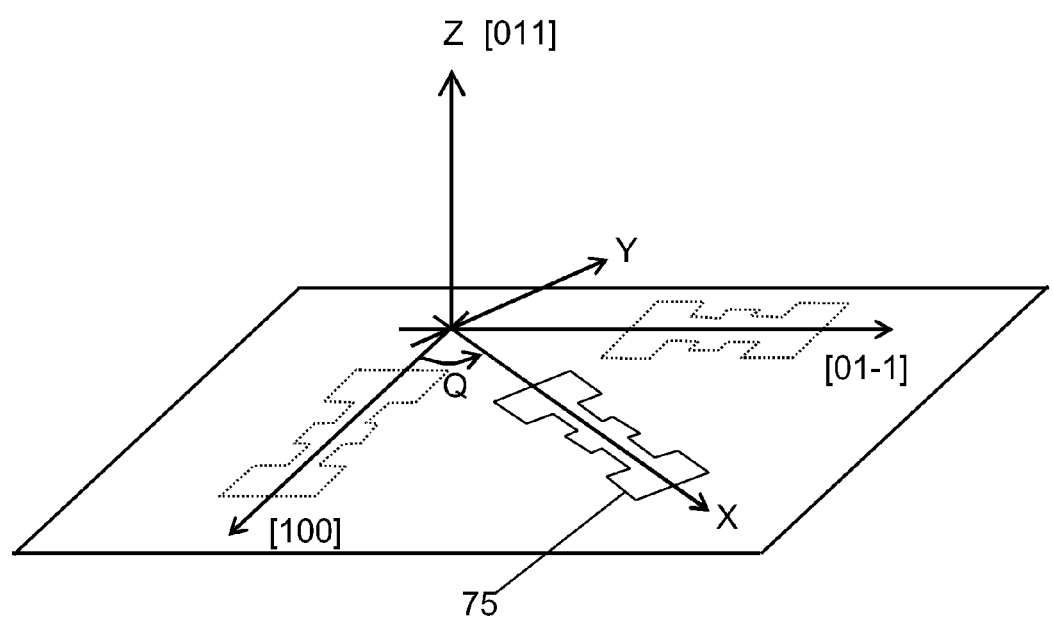
FIG. 8 shows axes of coordinates in the examples 1-8 and the comparative examples 1-2.
Figure 9A:
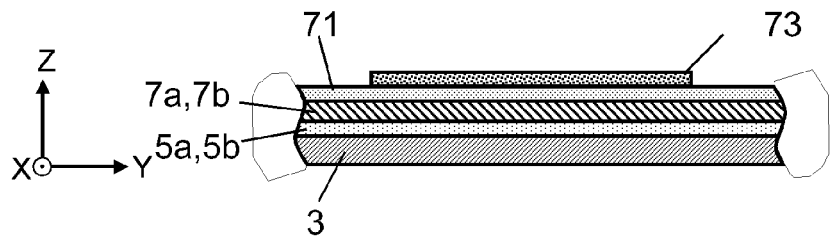
FIG. 9A shows one step included in the method for fabricating the actuator according to the example 1.
Figure 9B:
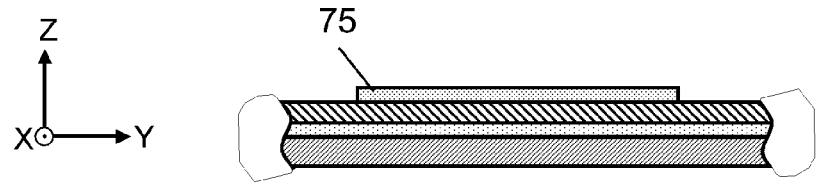
FIG. 9B shows one step included in the method for fabricating the actuator according to the example 1, subsequently to FIG. 9A.

Etching gas: Gaseous mixture of chlorine and oxygen ($Cl_2/O_2$ flow ratio: 40/20)
RF power: 600 W
Bias power: 100 W The resist pattern 73 was removed by ashing treatment using oxygen plasma. Subsequently, a mask pattern 75 was formed as shown in FIG. 9B. As shown in FIG. 8, the angular degree Q was set at 45 degrees.

Using this mask pattern 75, an unnecessary parts of the first (Bi, Na, Ba) $TiO_3$ layer 7*a* and the second (Bi, Na, Ba) $TiO_3$ layer 7*b* were dry-etched.

The condition of the dry etching is described below.

Etching gas: Gaseous mixture of tetrafluoromethane and argon ($CF_4/Ar$ flow ratio: 30/70)
RF power: 1,000 W
Bias power: 100 W Then, using the mask pattern 75 again, an unnecessary part of the first electrode layer 5*a* and the third electrode layer 5*b* were dry-etched.

The condition of the dry etching is described below.

Etching gas: Argon
RF power: 800 W
Bias power: 100 W

Subsequently, the mask pattern 75 was removed by wet etching using diammonium cerium (IV) nitrate.

Figure 9C:
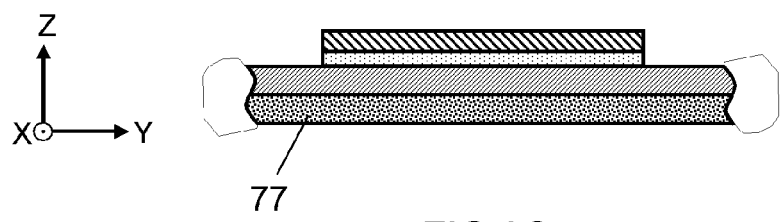
FIG. 9C shows one step included in the method for fabricating the actuator according to the example 1, subsequently to FIG. 9B.

As shown in FIG. 9C, a resist film 77 was formed on the reverse surface of the MgO single crystalline substrate 3.

Figure 9D:
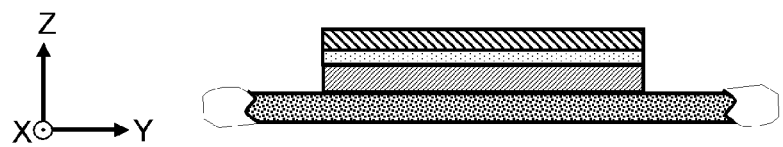
FIG. 9D shows one step included in the method for fabricating the actuator according to the example 1, subsequently to FIG. 9C.

As shown in FIG. 9D, the MgO single crystalline substrate 3 was patterned by wet etching using hot phosphoric acid. The resist film 77 was then removed afterwards by ashing treatment with oxygen plasma.

Figure 9E:
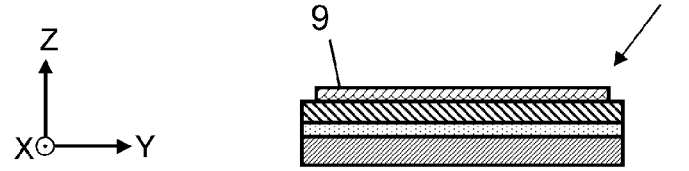
FIG. 9E shows one step included in the method for fabricating the actuator according to the example 1, subsequently to FIG. 9D.

Finally, as shown in FIG. 9E, the second electrode layer 9*a* and the fourth electrode layer 9*b* were formed on the obverse surface of the first (Bi, Na, Ba) $TiO_3$ layer 7*a* and the second (Bi, Na, Ba) $TiO_3$ layer 7*b*, respectively, using a shadow mask (not shown) by an evaporation method. Each of the second electrode layer 9*a* and the fourth electrode layer 9*b* were formed of a gold film having a thickness of 100 nanometers. Similarly, the mirror machine 30 was formed on the tilt part 25. This mirror 30 was also formed of a gold film having a thickness of 100 nanometers. In this way, the actuator 1 was fabricated.

The actuator 1 thus obtained was driven as below.

First, the tilt part 25 was irradiated with laser beam. This laser beam was reflected by the mirror 30. The reflected light was projected on a screen disposed away from the actuator 1.

Then, voltages shown in Table 1 were applied to the first electrode layer 5*a*, the second electrode layer 9*a*, the third electrode layer 5*b*, and the fourth electrode layer 9*b* to tilt the tilt part 25. The tilt angular degree P was calculated on the basis of the movement distance of the reflected light projected on the screen.

TABLE 1

| First electrode layer 5a (Voltage: V5a) | Second electrode layer 9a (Voltage: V9a) | Third electrode layer 5b (voltage: V5b) | Fourth electrode layer 9b (voltage: V9b) | Tilt angular degree P |
| --- | --- | --- | --- | --- |
| 0 | −30 | 0 | +30 | 0.56 |
| 0 | −15 | 0 | +15 | 0.28 |
| 0 | 0 | 0 | 0 | 0 |
| 0 | +15 | 0 | −15 | −0.28 |
| 0 | +30 | 0 | −15 | +0.56 |

As is clear from Table 1, the tilt part 25 was tilted.

Example 2

An actuator similar to the actuator according to the example 1 was fabricated except that the angular degree Q was set at 30 degrees. Similarly to the example 1, the voltages of 0 volts, −30 volts, 0 volts, and +30 volt were applied to the first electrode layer 5a, the second electrode layer 9a, the third electrode layer 5b, and the fourth electrode layer 9b, respectively, so as to tilt the tilt part 25. The tilt angular degree P is shown in Table 2.

Example 3

An actuator similar to the actuator according to the example 1 was fabricated except that the angular degree Q was set at 15 degrees. Similarly to the example 1, the voltages of 0 volts, −30 volts, 0 volts, and +30 volt were applied to the first electrode layer 5a, the second electrode layer 9a, the third electrode layer 5b, and the fourth electrode layer 9b, respectively, so as to tilt the tilt part 25. The tilt angular degree P is shown in Table 2.

Example 4

An actuator similar to the actuator according to the example 1 was fabricated except that the angular degree Q was set at 60 degrees. Similarly to the example 1, the voltages of 0 volts, −30 volts, 0 volts, and +30 volt were applied to the first electrode layer 5a, the second electrode layer 9a, the third electrode layer 5b, and the fourth electrode layer 9b, respectively, so as to tilt the tilt part 25. The tilt angular degree P is shown in Table 2.

Example 5

An actuator similar to the actuator according to the example 1 was fabricated except that the angular degree Q was set at 75 degrees. Similarly to the example 1, the voltages of 0 volts, −30 volts, 0 volts, and +30 volt were applied to the first electrode layer 5a, the second electrode layer 9a, the third electrode layer 5b, and the fourth electrode layer 9b, respectively, so as to tilt the tilt part 25. The tilt angular degree P is shown in Table 2.

Comparative Example 1

An actuator similar to the actuator according to the example 1 was fabricated except that the angular degree Q was set at 0 degrees. Similarly to the example 1, the voltages of 0 volts, −30 volts, 0 volts, and +30 volt were applied to the first electrode layer 5a, the second electrode layer 9a, the third electrode layer 5b, and the fourth electrode layer 9b, respectively, so as to tilt the tilt part 25. The tilt angular degree P is shown in Table 2.

Comparative Example 2

An actuator similar to the actuator according to the example 1 was fabricated except that the angular degree Q was set at 90 degrees. Similarly to the example 1, the voltages of 0 volts, −30 volts, 0 volts, and +30 volts were applied to the first electrode layer 5a, the second electrode layer 9a, the third electrode layer 5b, and the fourth electrode layer 9b, respectively, so as to tilt the tilt part 25. The tilt angular degree P is shown in Table 2.

Comparative Example 3

Figure 12:
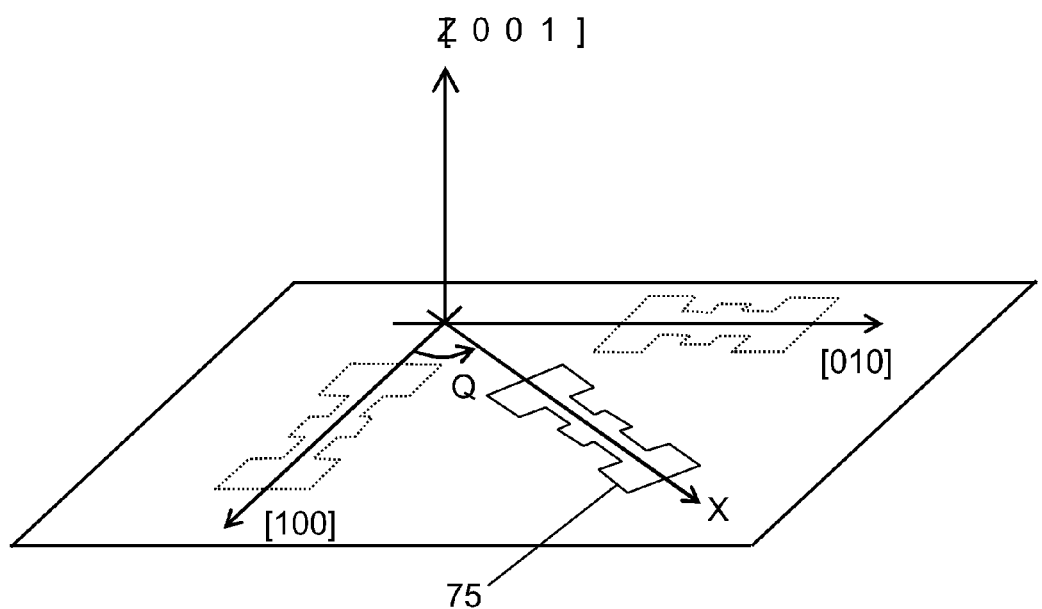
FIG. 12 shows axes of coordinates in the comparative example 3.
Figure 13:
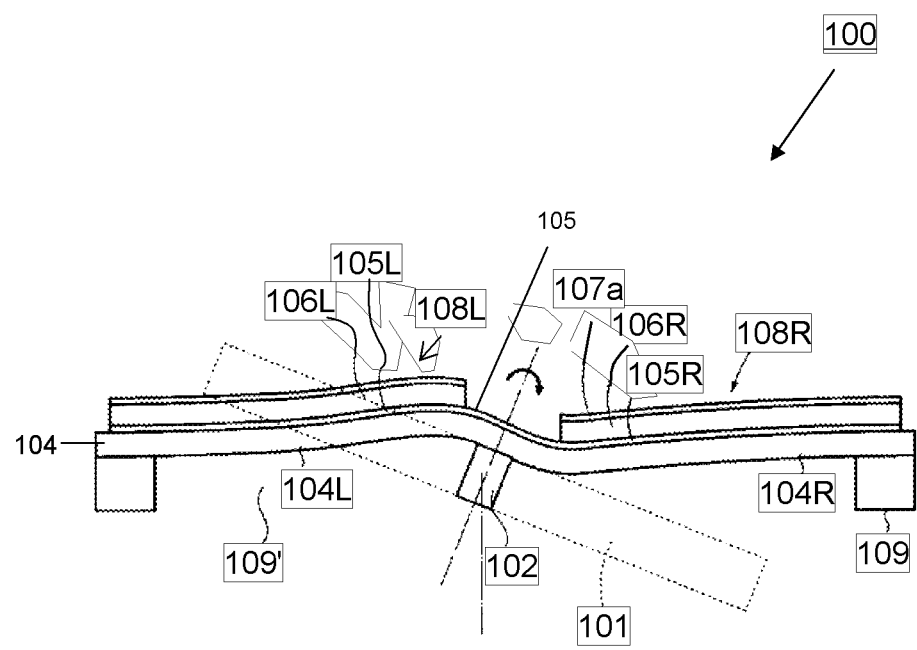
FIG. 13 shows a cross-sectional view of the actuator 100 disclosed in Japanese Patent Laid-Open Publication No. 2009-169290.

An actuator similar to the actuator according to the example 1 was fabricated except that the +Z direction is the [001] direction. FIG. 12 shows the axes of coordinate in the comparative example 3. In the comparative example 3, the angular degree Q was set at 45 degrees. Similarly to the example 1, the voltages of 0 volts, −30 volts, 0 volts, and +30 volts were applied to the first electrode layer 5a, the second electrode layer 9a, the third electrode layer 5b, and the fourth electrode layer 9b, respectively, so as to tilt the tilt part 25. The tilt angular degree P is shown in Table 2.

TABLE 2

|  | Angular degree Q | Tilt angular degree P |
| --- | --- | --- |
| Comparative example 1 | 0 | 0 |
| Example 3 | 15 | 0.31 |
| Example 2 | 30 | 0.48 |
| Example 1 | 45 | 0.56 |
| Example 4 | 60 | 0.48 |
| Example 5 | 75 | 0.28 |
| Comparative example 2 | 90 | 0 |
| Comparative example 3 | 45 | 0 |

As is clear from Table 2, it is necessary that the angular degree Q is more than zero degrees and less than 90 degrees. It is preferable that the angular degree Q is not less than 15 degrees and not more than 75 degrees. It is more preferable that the angular degree Q is not less than 30 degrees and not more than 60 degrees.

As is clear from the comparative example 3, it is necessary that the (Bi,Na,Ba)TiO$_3$ layer is preferentially oriented in the [011] direction. It is more preferable that the (Bi,Na,Ba)TiO$_3$ layer is oriented only in the [011] direction.

Example 6

An actuator similar to the actuator according to the example 1 was fabricated except that each of the first (Bi, Na, Ba) TiO$_3$ layer 7a and the second (Bi, Na, Ba) TiO$_3$ layer 7b was substituted with a laminate of a (Bi, Na, Ba) TiO$_3$ layer and a (1−y)[(Bi,Na,Ba)TiO$_3$]−yBiFeO$_3$ layer. Similarly to the example 1, the voltages of 0 volts, −30 volts, 0 volts, and +30 volt were applied to the first electrode layer 5a, the second electrode layer 9a, the third electrode layer 5b, and the fourth electrode layer 9b, respectively, so as to tilt the tilt part 25. The tilt angular degree P is shown in Table 3.

The (Bi, Na, Ba) TiO₃ layer and the (1−y)[(Bi,Na,Ba)TiO₃]−yBiFeO₃ layer were formed as below.

First, a (Bi, Na, Ba) TiO₃ layer was deposited on the surface of the first electrode layer 5a and the third electrode layer 5b by an RF magnetron sputtering method. This (Bi, Na, Ba) TiO₃ layer had a thickness of 1.35 micrometers.

The condition of the RF magnetron sputtering method is described below.

Target: Above-mentioned composition
Atmosphere: Gaseous mixture of argon and oxygen (Ar/O₂ flow ratio: 50/50)
RF power: 170 W
Substrate temperature: 650 Celsius degrees Then, the (1−y)[(Bi,Na,Ba)TiO₃]−yBiFeO₃ (y=0.3) layer was deposited on the surface of the (Bi, Na, Ba) TiO₃ layer by an RF magnetron sputtering method. This (1−y)[(Bi,Na,Ba)TiO₃]−yBiFeO₃ (y=0.3) layer had a thickness of 1.35 micrometers.

The condition of the RF magnetron sputtering method is described below.

Target: Above-mentioned composition
Atmosphere: Gaseous mixture of argon and oxygen (Ar/O₂ flow ratio: 50/50)
RF power: 170 W
Substrate temperature: 650 Celsius degrees Example 7

An actuator similar to the actuator according to the example 6 was fabricated except that the (Bi, Na, Ba) TiO₃ layer had a thickness of 1.6 micrometers and except that (1−y)[(Bi,Na,Ba)TiO₃]−yBiFeO₃ (y=0.3) layer had a thickness of 1.1 micrometers. Similarly to the example 1, the voltages of 0 volts, −30 volts, 0 volts, and +30 volts were applied to the first electrode layer 5a, the second electrode layer 9a, the third electrode layer 5b, and the fourth electrode layer 9b, respectively, so as to tilt the tilt part 25. The tilt angular degree P is shown in Table 3.

Example 8

An actuator similar to the actuator according to the example 6 was fabricated except that the (Bi, Na, Ba) TiO₃ layer had a thickness of 1.1 micrometers and except that (1−y)[(Bi,Na,Ba)TiO₃]−yBiFeO₃ (y=0.3) layer had a thickness of 1.6 micrometers. Similarly to the example 1, the voltages of 0 volts, −30 volts, 0 volts, and +30 volts were applied to the first electrode layer 5a, the second electrode layer 9a, the third electrode layer 5b, and the fourth electrode layer 9b, respectively, so as to tilt the tilt part 25. The tilt angular degree P is shown in Table 3.

TABLE 3

|  | Tilt angular degree P |
|---|---|
| Example 6 | 0.62 |
| Example 7 | 0.60 |
| Example 8 | 0.60 |

INDUSTRIAL APPLICABILITY

The actuator according to the embodiment may be used for a laser scanner.

REFERENCE SIGNS LIST

1: actuator
5a: first electrode layer
5b: third electrode layer
7a: first (Bi, Na, Ba) TiO₃ layer
7b: second (Bi, Na, Ba) TiO₃ layer
9a: second electrode layer
9b: fourth electrode layer
11a: first laminate
11b: second laminate
13a: first support
13b: second support
25: tilt part
25a: first edge
25b: second edge
Q: angular degree formed between the [100] direction and the longitudinal direction of the first laminate 11, namely, the +X direction
P: tilt angular degree

The invention claimed is:

1. A method for driving an actuator, the method comprising steps of:
   a step (a) of preparing the actuator comprising:
      a first laminate;
      a second laminate;
      a first support;
      a second support; and
      a tilt part, wherein
   the first laminate comprises a first electrode layer, a first (Bi, Na, Ba) TiO₃ layer, and a second electrode layer,
   the first electrode layer, the first (Bi, Na, Ba) TiO₃ layer, and the second electrode layer are laminated in such a manner that the first (Bi, Na, Ba) TiO₃ layer is interposed between the first electrode layer and the second electrode layer,
   the first (Bi, Na, Ba) TiO₃ layer is preferentially oriented in a [011] crystalline axis direction,
   +Z direction is parallel to the [011] crystalline axis direction,
   −Z direction is the reverse direction of the +Z direction,
   +X direction is parallel to the longitudinal direction of the first laminate,
   −X direction is the reverse direction of the +X direction,
   +Y direction is perpendicular to both of the +X direction and the +Z direction in a right-handed coordinate system,
   −Y direction is the reverse direction of the +Y direction,
   the laminate direction of the first laminate is parallel to the +Z direction,
   the second laminate comprises a third electrode layer, a second (Bi, Na, Ba) TiO₃ layer, and a fourth electrode layer,
   the second (Bi, Na, Ba) TiO₃ layer is preferentially oriented in the [011] crystalline axis direction,
   the second (Bi, Na, Ba) TiO₃ layer is interposed between the third electrode layer and the fourth electrode layer along the +Z direction,
   the tilt part is interposed between the first laminate and the second laminate along the +X direction,
   the tilt part comprises a first edge and a second edge,
   the first edge and the second edge are located in the +Y side and the −Y side, respectively, in the XY plane,
   one end of the first laminate is fixed to the first support,
   one end of the second laminate is fixed to the second support, and
   in the XY plane, an angular degree Q formed between the +X direction and a [100] direction is more than 0 degrees and less than 90 degrees, and
   a step (b) of applying the voltages V5a, V9a, V5b, and V9b which satisfy the following requirement A or B to the first electrode layer, the second electrode layer, the third electrode layer, and the fourth electrode layer, respectively, so as to tilt the tilt part in such a manner that one of the first edge and the second edge is moved in the +Z direction and the other is moved in the −Z direction;

Requirement A: V5$a$>V9$a$ and V5$b$<V9$b$

Requirement B: V5$a$<V9$a$ and V5$b$>V9$b$.

2. The method according to claim 1, wherein
in the step (b), the requirement A is satisfied; and
the first edge is moved in the −Z direction and the second edge is moved in the +Z direction.

3. The method according to claim 1, wherein
in the step (b), the requirement B is satisfied; and
the first edge is moved in the +Z direction and the second edge is moved in the −Z direction.

4. The method according to claim 1, wherein
the angular degree Q is not less than 15 degrees and not more than 75 degrees.

5. The method according to claim 1, wherein
the angular degree Q is not less than 30 degrees and not more than 60 degrees.

6. The method according to claim 1, wherein
the first electrode layer is formed integrally with the third electrode layer.

7. The method according to claim 1, wherein
the first (Bi, Na, Ba) TiO$_3$ layer is formed integrally with the second (Bi, Na, Ba) TiO$_3$ layer.

8. The method according to claim 1, wherein
the first (Bi, Na, Ba) TiO$_3$ layer is formed of (Bi$_{0.5}$Na$_{0.5}$)TiO$_3$—BaTiO$_3$; and
the second (Bi, Na, Ba) TiO$_3$ layer is formed of (Bi$_{0.5}$Na$_{0.5}$)TiO$_3$—BaTiO$_3$.

9. The method according to claim 1, wherein
the first (Bi, Na, Ba) TiO$_3$ layer is formed of a laminate of a (1−x)(Bi$_{0.5}$,Na$_{0.5}$)TiO$_3$)−x(BaTiO$_3$) layer (0.01≤x≤0.15) and a (1−y)[(Bi,Na,Ba)TiO$_3$]−yBiFeO$_3$ layer (0.20≤y≤0.50); and
the second (Bi, Na, Ba) TiO$_3$ layer is formed of a laminate of a (1−x)(Bi$_{0.5}$,Na$_{0.5}$)TiO$_3$)−x(BaTiO$_3$) layer (0.01≤x≤0.15) and a (1−y)[(Bi,Na,Ba)TiO$_3$]−yBiFeO$_3$ layer (0.20≤y≤0.50).

10. An actuator comprising:
a first laminate;
a second laminate;
a first support;
a second support; and
a tilt part, wherein
the first laminate comprises a first electrode layer, a first (Bi, Na, Ba) TiO$_3$ layer, and a second electrode layer;
the first electrode layer, the first (Bi, Na, Ba) TiO$_3$ layer, and the second electrode layer are laminated in such a manner that the first (Bi, Na, Ba) TiO$_3$ layer is interposed between the first electrode layer and the second electrode layer;
the first (Bi, Na, Ba) TiO$_3$ layer is preferentially oriented in a [011] crystalline axis direction;
+Z direction is parallel to the [011] crystalline axis direction;
−Z direction is the reverse direction of the +Z direction;
+X direction is parallel to the longitudinal direction of the first laminate;
−X direction is the reverse direction of the +X direction;
+Y direction is perpendicular to both of the +X direction and the +Z direction in a right-handed coordinate system;
−Y direction is the reverse direction of the +Y direction;
the laminate direction of the first laminate is parallel to the +Z direction;
the second laminate comprises a third electrode layer, a second (Bi, Na, Ba) TiO$_3$ layer, and a fourth electrode layer;
the second (Bi, Na, Ba) TiO$_3$ layer is preferentially oriented in the [011] crystalline axis direction;
the second (Bi, Na, Ba) TiO$_3$ layer is interposed between the third electrode layer and the fourth electrode layer along the +Z direction;
the tilt part is interposed between the first laminate and the second laminate along the +X direction;
the tilt part comprises a first edge and a second edge;
the first edge and the second edge are located in the +Y side and the −Y side, respectively, in the XY plane;
one end of the first laminate is fixed to the first support;
one end of the second laminate is fixed to the second support and;
in the XY plane, an angular degree Q formed between the +X direction and a [100] direction is more than 0 degrees and less than 90 degrees.

11. The actuator according to claim 10, wherein
the angular degree Q is not less than 15 degrees and not more than 75 degrees.

12. The actuator according to claim 10, wherein
the angular degree Q is not less than 30 degrees and not more than 60 degrees.

13. The actuator according to claim 10, wherein
the first electrode layer is formed integrally with the third electrode layer.

14. The actuator according to claim 10, wherein
the first (Bi, Na, Ba) TiO$_3$ layer is formed integrally with the second (Bi, Na, Ba) TiO$_3$ layer.

15. The actuator according to claim 10, wherein
the first (Bi, Na, Ba) TiO$_3$ layer is formed of (Bi$_{0.5}$Na$_{0.5}$)TiO$_3$—BaTiO$_3$; and
the second (Bi, Na, Ba) TiO$_3$ layer is formed of (Bi$_{0.5}$Na$_{0.5}$)TiO$_3$—BaTiO$_3$.

16. The actuator according to claim 10, wherein
the first (Bi, Na, Ba) TiO$_3$ layer is formed of a laminate of a (1−y)(Bi$_{0.5}$,Na$_{0.5}$)TiO$_3$)−x(BaTiO$_3$) layer (0.01≤x≤0.15) and a (1−y)[(Bi,Na,Ba)TiO$_3$]−yBiFeO$_3$ layer (0.20≤y≤0.50); and
the second (Bi, Na, Ba) TiO$_3$ layer is formed of a laminate of a (1−y)(Bi$_{0.5}$,Na$_{0.5}$)TiO$_3$)−x(BaTiO$_3$) layer (0.01≤x≤0.15) and a (1−y)[(Bi,Na,Ba)TiO$_3$]−yBiFeO$_3$ layer (0.20≤y≤0.50).

* * * * *